(12) United States Patent
Yang et al.

(10) Patent No.: US 7,935,593 B2
(45) Date of Patent: May 3, 2011

(54) STRESS OPTIMIZATION IN DUAL EMBEDDED EPITAXIALLY GROWN SEMICONDUCTOR PROCESSING

(75) Inventors: Jong Ho Yang, SeongNam (KR); Jin-Ping Han, Fishkill, NY (US); Chung Woh Lai, Singapore (SG); Henry Utomo, Newburgh, NY (US)

(73) Assignees: Samsung Electronics Co., Ltd., Suwon-Si (KR); International Business Machines Corporation, Armonk, NY (US); Chartered Semiconductor Manufacturing Ltd., Singapore (SG); Infineon Technologies AG, Neubiberg (DE)

( * ) Notice: Subject to any disclaimer, the term of this patent is extended or adjusted under 35 U.S.C. 154(b) by 149 days.

(21) Appl. No.: 12/366,356

(22) Filed: Feb. 5, 2009

(65) Prior Publication Data

US 2010/0197093 A1    Aug. 5, 2010

(51) Int. Cl.
*H01L 21/8238*    (2006.01)

(52) U.S. Cl. ............... 438/231; 257/E21.634; 438/300
(58) Field of Classification Search ............... 438/231, 438/300; 257/E21.634
See application file for complete search history.

(56) References Cited

U.S. PATENT DOCUMENTS

| 7,282,415 | B2 | 10/2007 | Zhang et al. | |
| 7,402,496 | B2* | 7/2008 | Liu et al. ............... | 438/300 |
| 2005/0082616 | A1 | 4/2005 | Chen et al. | |
| 2008/0251851 | A1* | 10/2008 | Pan et al. ............... | 257/369 |
| 2010/0197092 | A1* | 8/2010 | Kim et al. ............... | 438/229 |

FOREIGN PATENT DOCUMENTS

KR    1020070096507    10/2007

* cited by examiner

*Primary Examiner* — Matthew S Smith
*Assistant Examiner* — Christine Enad
*(74) Attorney, Agent, or Firm* — F. Chau & Associates, LLC

(57) ABSTRACT

Embodiments of the present disclosure provide stress optimization during manufacturing of dual embedded epitaxially grown (EPI) semiconductor structures using just two masks, such as nFET and pFET open for embedded epitaxial using SiC and SiGe, and separated halo implantation masks for both horizontal and vertical PC

27 Claims, 23 Drawing Sheets

US 7,935,593 B2

STRESS OPTIMIZATION IN DUAL EMBEDDED EPITAXIALLY GROWN SEMICONDUCTOR PROCESSING

BACKGROUND OF THE INVENTION

The present disclosure generally relates to semiconductor integrated circuits. More particularly, the present disclosure relates to the optimization of stress in dual embedded epitaxially grown semiconductor structures.

SUMMARY OF THE INVENTION

These and other issues are addressed by methods for stress optimization in dual embedded epitaxially grown (EPI) structures of semiconductor devices. Exemplary embodiments are provided.

An exemplary embodiment method for manufacturing dual embedded epitaxially grown semiconductor transistors includes depositing a first elongated oxide spacer over first and second transistors of different types, depositing a first elongated nitride spacer on the first oxide spacer, depositing a first photoresist block on the nitride spacer above the first transistor, etching the first nitride spacer above the second transistor, implanting a first halo around the second transistor, etching a first recess in an outer portion of the first halo, stripping the first photoresist above the first transistor, forming a first epitaxially grown semiconductor material in the first recess, implanting a first extension in a top portion of the first material, depositing an elongated blocking oxide over the first and second transistors and first extension, depositing a second photoresist block on the blocking oxide above the second transistor and first extension, etching the blocking oxide and first nitride spacer above the first transistor, implanting a second halo around the first transistor, etching a second recess in an outer portion of the second halo, stripping the second photoresist above the second transistor, forming a second epitaxially grown semiconductor material in the second recess, implanting a second extension in a top portion of the second material, etching the blocking oxide above the second transistor, etching nitride caps from the first and second transistors, depositing a second elongated oxide spacer on the first and second transistors, depositing a second elongated nitride spacer on the second oxide spacer, etching the second nitride spacer to leave nitride sidewalls around gates of the first and second transistors, and implanting deep sources and drains in the first and second transistors.

The present disclosure will be further understood from the following description of exemplary embodiments, which is to be read in connection with the accompanying drawings.

BRIEF DESCRIPTION OF THE DRAWINGS

The present disclosure provides methods for stress optimization in dual embedded epitaxially grown (EPI) structures of semiconductor devices in accordance with the following exemplary figures, in which.

DETAILED DESCRIPTION OF PREFERRED EMBODIMENTS

Exemplary methods are provided for stress optimization in dual embedded epitaxially grown (EPI) structures of complementary metal-oxide semiconductor (CMOS) devices. Silicon-Carbide (SiC) exhibits tensile stress. Silicon-Germanium (SiGe) exhibits compressive stress when on Silicon (Si). Although previous methods typically used up to six masks for processing dual embedded EPI structures, embodiments of the present disclosure use just two masks.

In an exemplary embodiment, halo implantation is performed early, before Si recessing. Just one mask is used for negative channel field effect transistors (nFET), and just one mask is used for positive channel field effect transistors (pFET). Dual halo implantations may be performed instead of quad halo implantations, and stress relaxation uses the two masks. Extension implantation uses a blanket without any additional mask. This is possible since the same dopants are used for nFET and for pFET, and they are to be recessed. For a pFET, arsenic (As) may be used for the halo, and boron and/or boron difluoride (B/BF2) may be used for the extension. For an nFET, B/BF2 may be used for the halo, and As may be used for the extension. A thick oxide may be used, such as about 500 Angstroms thick, so no additional mask is required. Here, the halo is high energy, such as about 50 KEV, and the extension is low energy, such as about 8 KEV. In a pFET channel, compression helps mobility. In an nFET channel, tension helps mobility.

Figure 1:
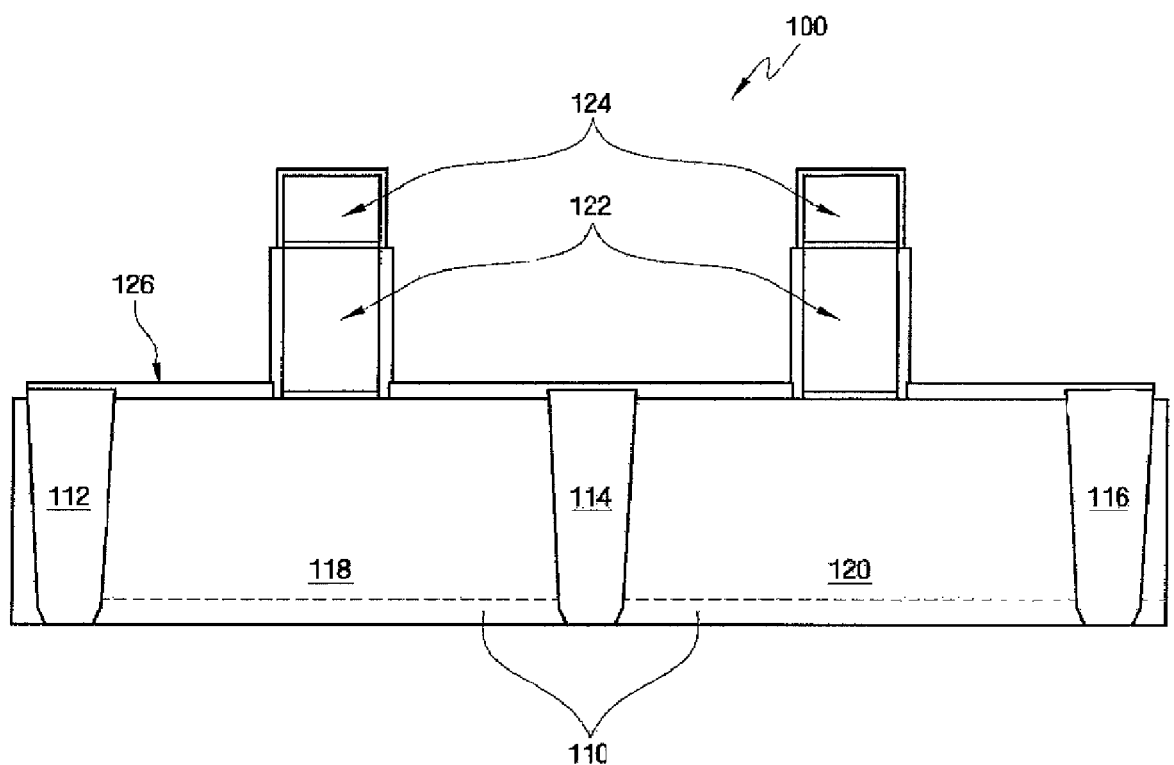
FIG. 1 shows a schematic vertical side view of a semiconductor structure after re-oxidation of spacer zero in accordance with an exemplary embodiment of the present disclosure.

As shown in FIG. 1, a semiconductor structure with re-oxidation for a zeroth spacer is indicated generally by the reference numeral 100. The structure 100 includes a substrate 110, first conductor 112, second conductor 114 and third conductor 116 all disposed in the substrate, a doped p-well region 118 in the substrate, and a doped n-well region 120 in the substrate. Polyconductor (Poly) gate portions 122 are disposed on each of the n-well and p-well regions, and nitride cap portions 124 are disposed on each of the Poly gate portions. The Poly gate and nitride cap on the p-well region form an nFET, and the Poly gate and nitride cap on the n-well region form a pFET. An oxide layer 126 is disposed on top of the p-well, nFET, n-well and pFET.

Figure 2:
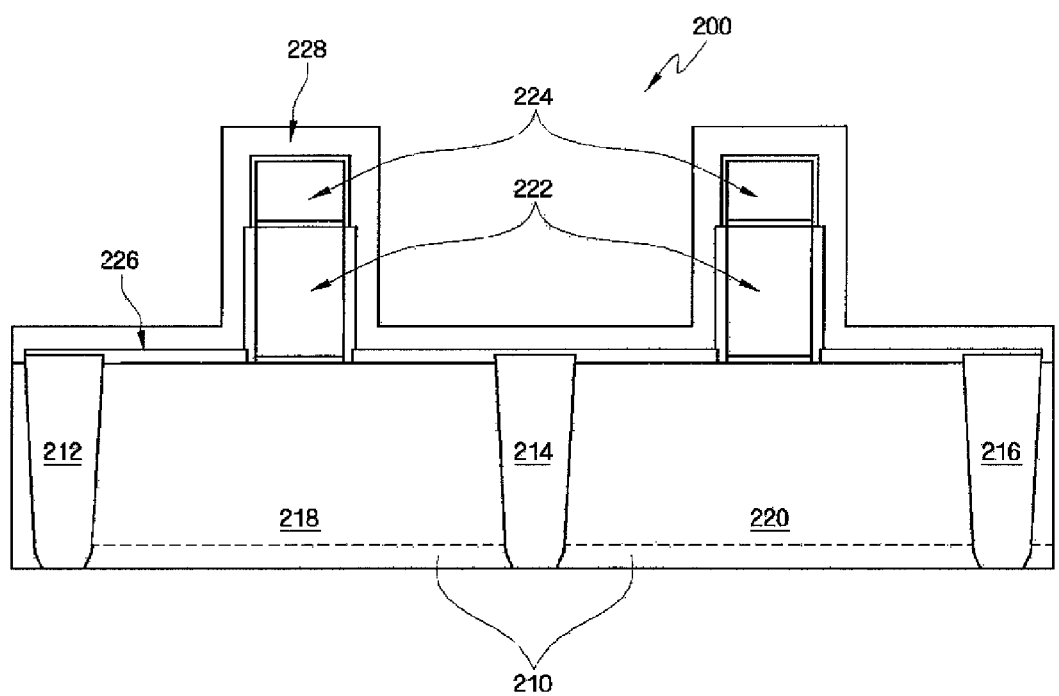
FIG. 2 shows a schematic vertical side view of a semiconductor structure after nitride deposition of spacer one in accordance with an exemplary embodiment of the present disclosure.

Turning to FIG. 2, a semiconductor structure with nitride deposition for first spacer is indicated generally by the reference numeral 200. The structure 200 is similar to the structure 100, so duplicate description may be omitted The structure 200 further includes a nitride layer 228 disposed on top of the oxide layer 226.

Figure 3:
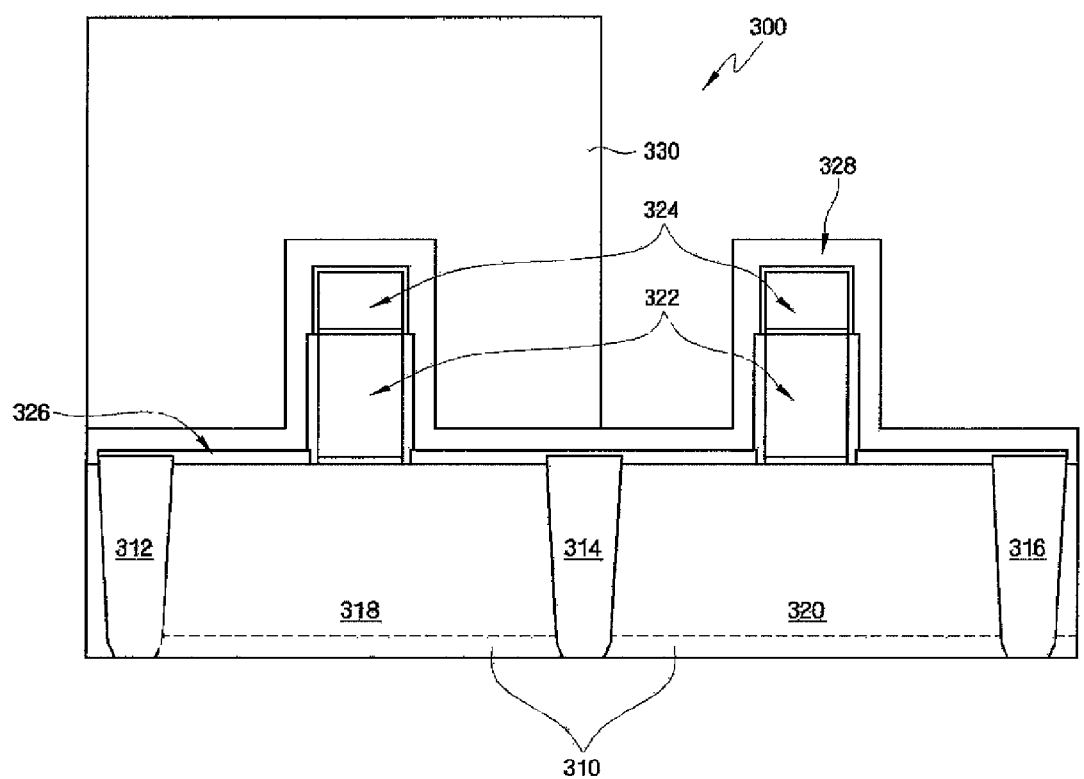
FIG. 3 shows a schematic vertical side view of a semiconductor structure having a pFET halo/extension implantation layer (PH) after deposition of photoresist by inductive plasma source (IPS) to block the negative channel field effect transistor (nFET) in accordance with an exemplary embodiment of the present disclosure.

Turning now to FIG. 3, a semiconductor structure having a pFET halolextension implantation layer (PH) with deposition of photoresist by inductive plasma source (IPS) to block the nFET is indicated generally by the reference numeral 300. The structure 300 is similar to the structure 200, so duplicate description may be omitted The structure 300 further includes a photoresist (PR) block 330 disposed on top of the portion of the nitride layer 328 that is substantially above the p-well 318, but not above the n-well 320.

Figure 4:
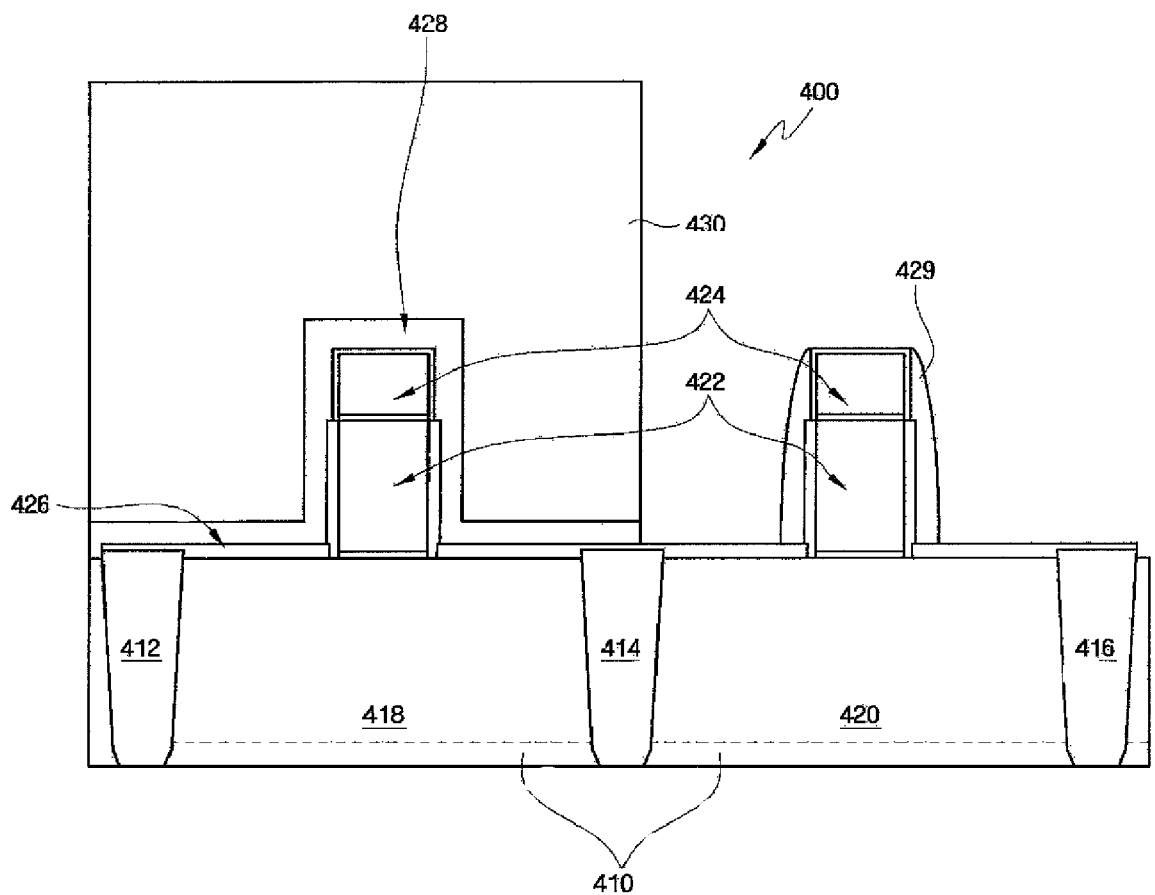
FIG. 4 shows a schematic vertical side view of a semiconductor structure after a reactive ion etch (RIE) of the nitride spacer one on the positive channel field effect transistor (pFET) in accordance with an exemplary embodiment of the present disclosure.

As shown in FIG. 4, a semiconductor structure with reactive ion etch (RIE) of first spacer nitride for pFET is indicated generally by the reference numeral 400. The structure 400 is similar to the structure 300, so duplicate description may be omitted. In the structure 400, the portion of the nitride layer 428 that was above the n-well 420 has been substantially reduced such that only nitride side walls 429 remain around the pFET.

Figure 5:
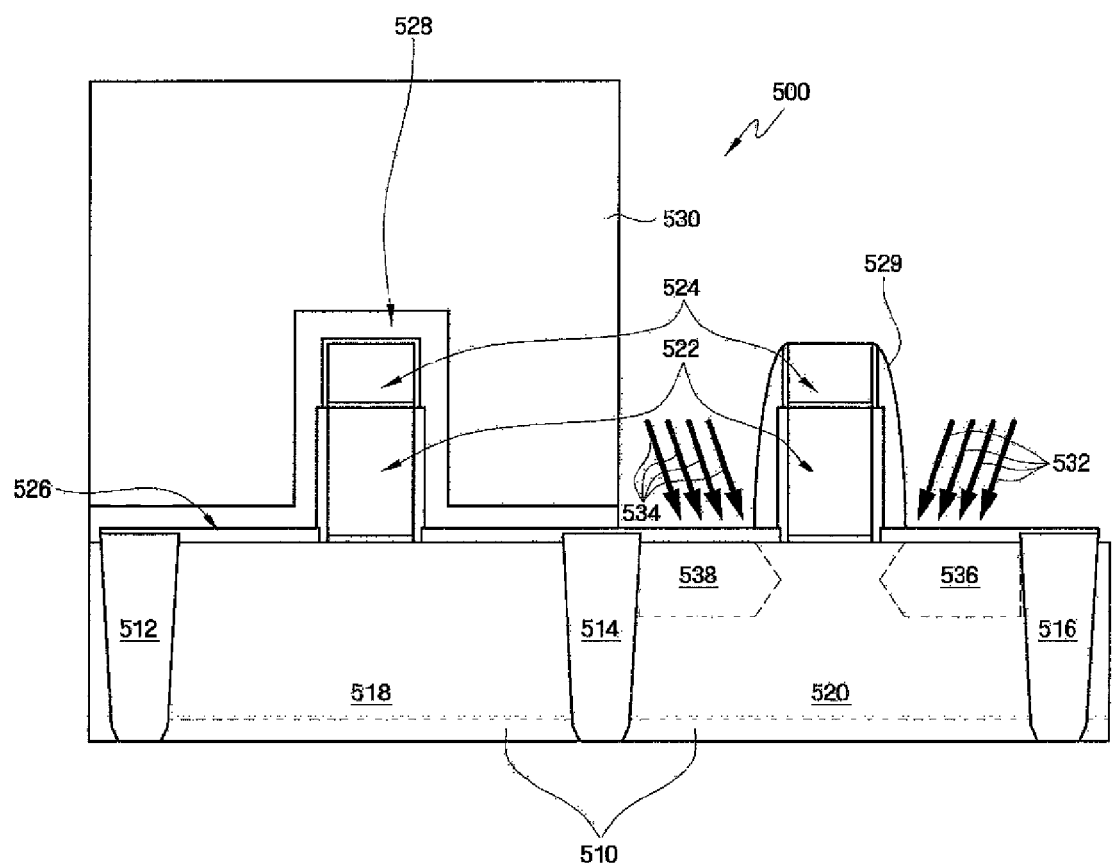
FIG. 5 shows a schematic vertical side view of a semiconductor structure during halo implantation around the pFET in accordance with an exemplary embodiment of the present disclosure.

Turning to FIG. 5, a semiconductor structure with halo implantation for pFET is indicated generally by the reference numeral 500. In this example, the halo implantation is a quad implantation with both horizontal and vertical components for both vertical and horizontal transistors. The structure 500 is similar to the structure 400, so duplicate description may be omitted. The structure 500 shows first and second halo implantation angles 532 and 534, with resulting halo portions 536 and 538, respectively. Here, the halo portion 536 is disposed in the n-well 520 adjacent to the third conductor 516, and the halo portion 538 is disposed in the n-well 520 adjacent to the second conductor 514.

Figure 6:
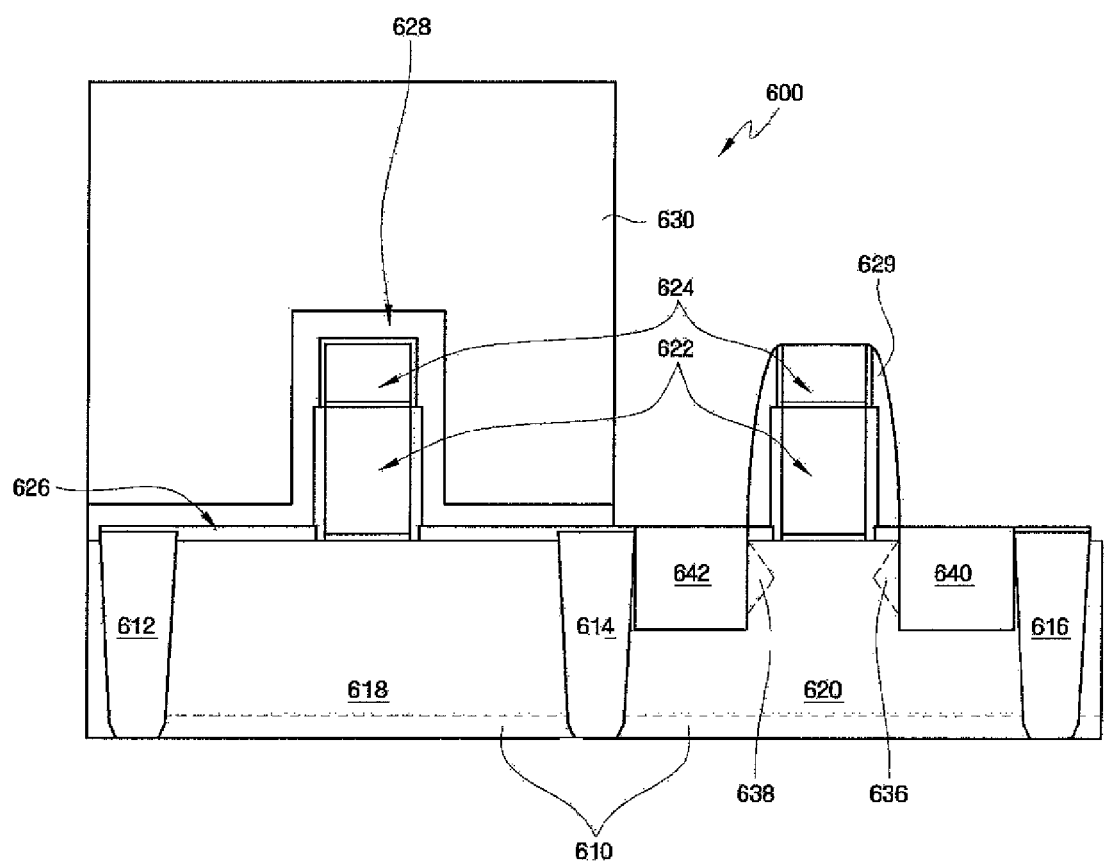
FIG. 6 shows a schematic vertical side view of a semiconductor structure after RIE to recess the silicon (Si) about the pFET in accordance with an exemplary embodiment of the present disclosure.

Turning now to FIG. 6, a semiconductor structure with Si recess RIE is indicated generally by the reference numeral 600. The structure 600 is similar to the structure 500, so duplicate description may be omitted. In the structure 600, Si recesses 640 and 642 have been removed from the halo portions 636 and 638, respectively.

Figure 7:
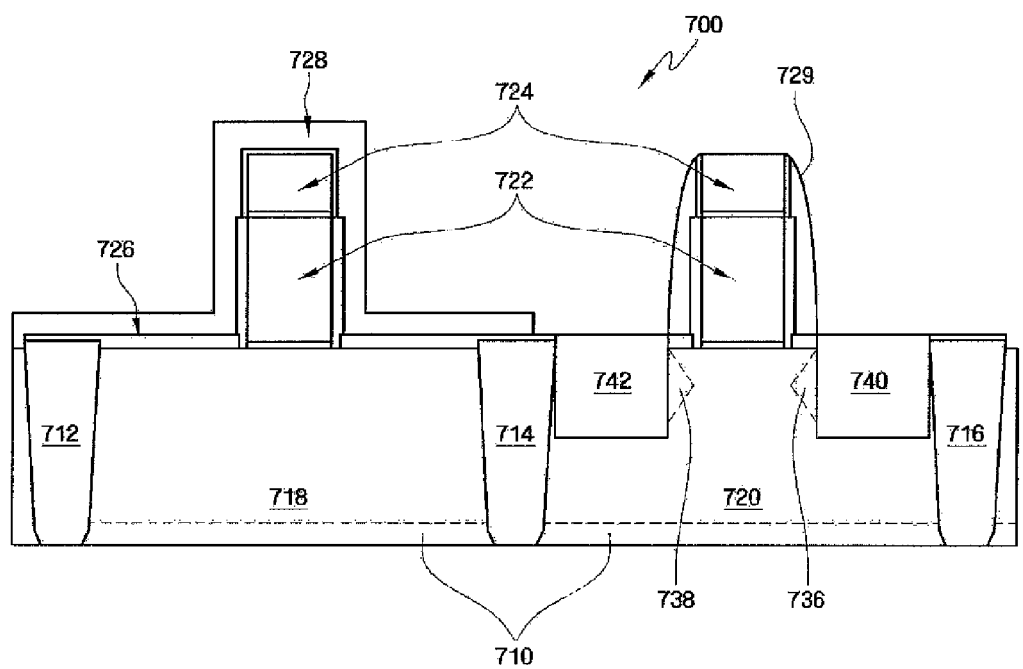
FIG. 7 shows a schematic vertical side view of a semiconductor structure after stripping the photoresist (PR) in accordance with an exemplary embodiment of the present disclosure.

As shown in FIG. 7, a semiconductor structure with photoresist (PR) strip is indicated generally by the reference numeral 700. The structure 700 is similar to the structure 600, so duplicate description may be omitted. In the structure 700, the photoresist has been stripped away, uncovering the nitride layer 728.

Figure 8:
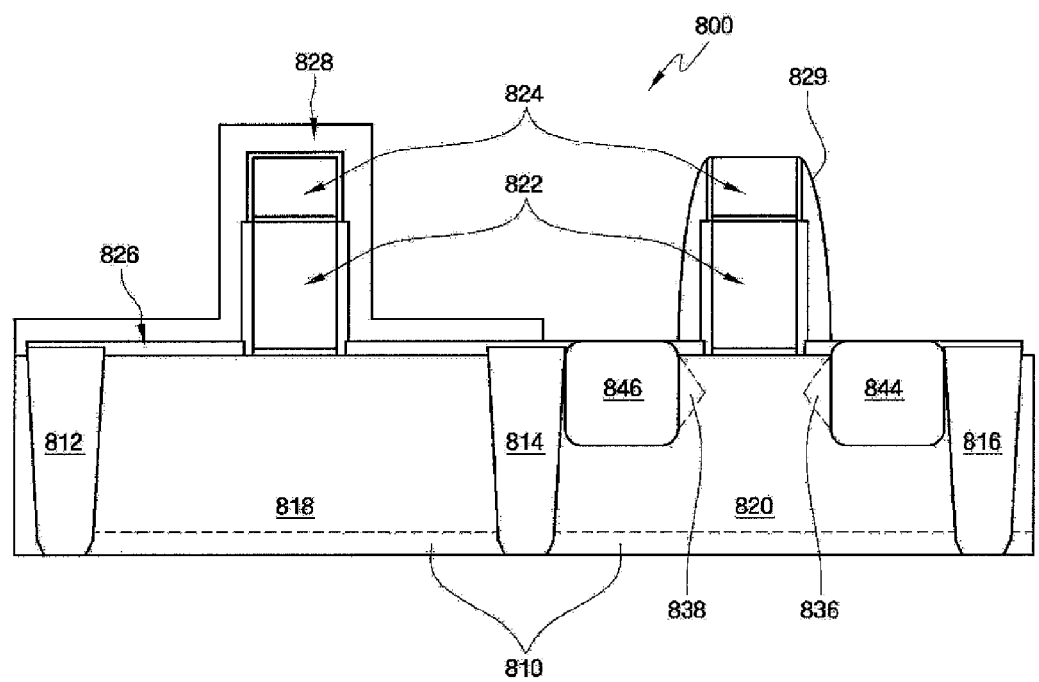
FIG. 8 shows a schematic vertical side view of a semiconductor structure after formation of epitaxially grown silicon-germanium (eSiGe) in accordance with an exemplary embodiment of the present disclosure.

Turning to FIG. 8, a semiconductor structure with epitaxially grown Silicon-Germanium (eSiGe) is indicated generally by the reference numeral 800. The structure 800 is similar to the structure 700, so duplicate description may be omitted. The structure 800 further includes silicon-germanium (SiGe) EPI portions 844 and 846 filling the Si recesses 840 and 842, respectively.

Figure 9:
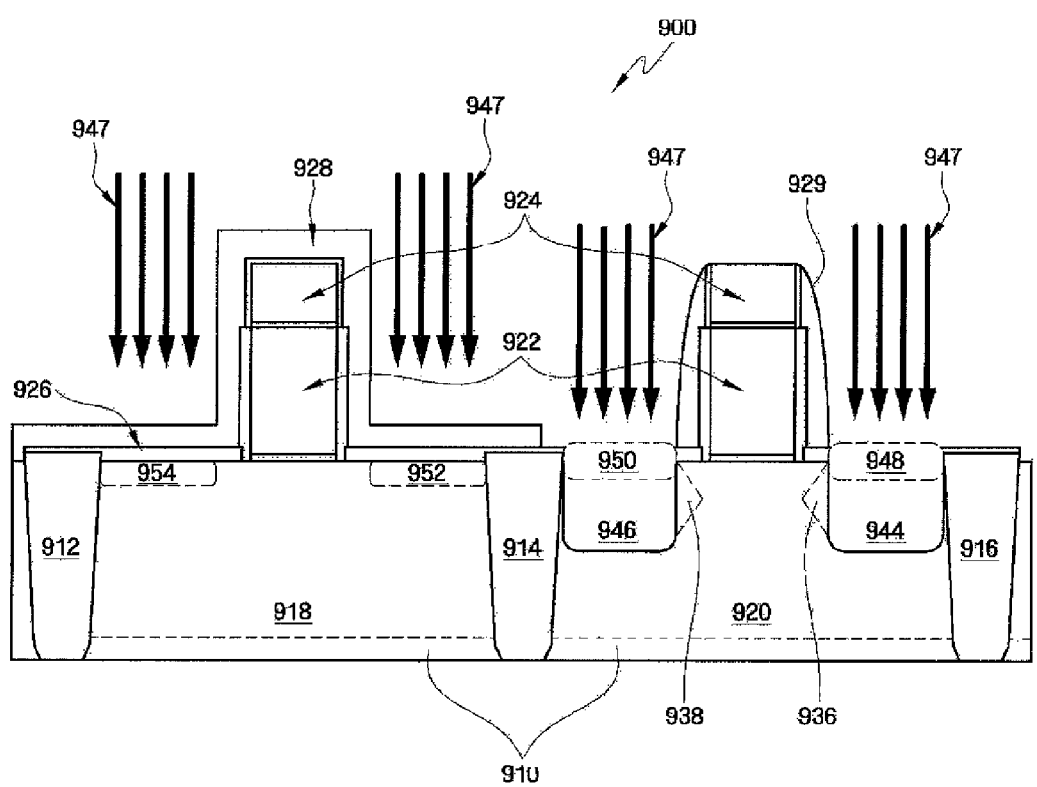
FIG. 9 shows a schematic vertical side view of a semiconductor structure during implantation of a pFET extension in accordance with an exemplary embodiment of the present disclosure.

Turning now to FIG. 9, a semiconductor structure with pFET extension implantation is indicated generally by the reference numeral 900. The structure 900 is similar to the structure 800, so duplicate description may be omitted. The structure 900 includes implantation flow 947, and extension portions 948 and 950 in the EPI portions 944 and 946 of the pFET, respectively. In addition, the structure 900 includes incidental implantation portions 952 and 954 in the nFET.

Figure 10:
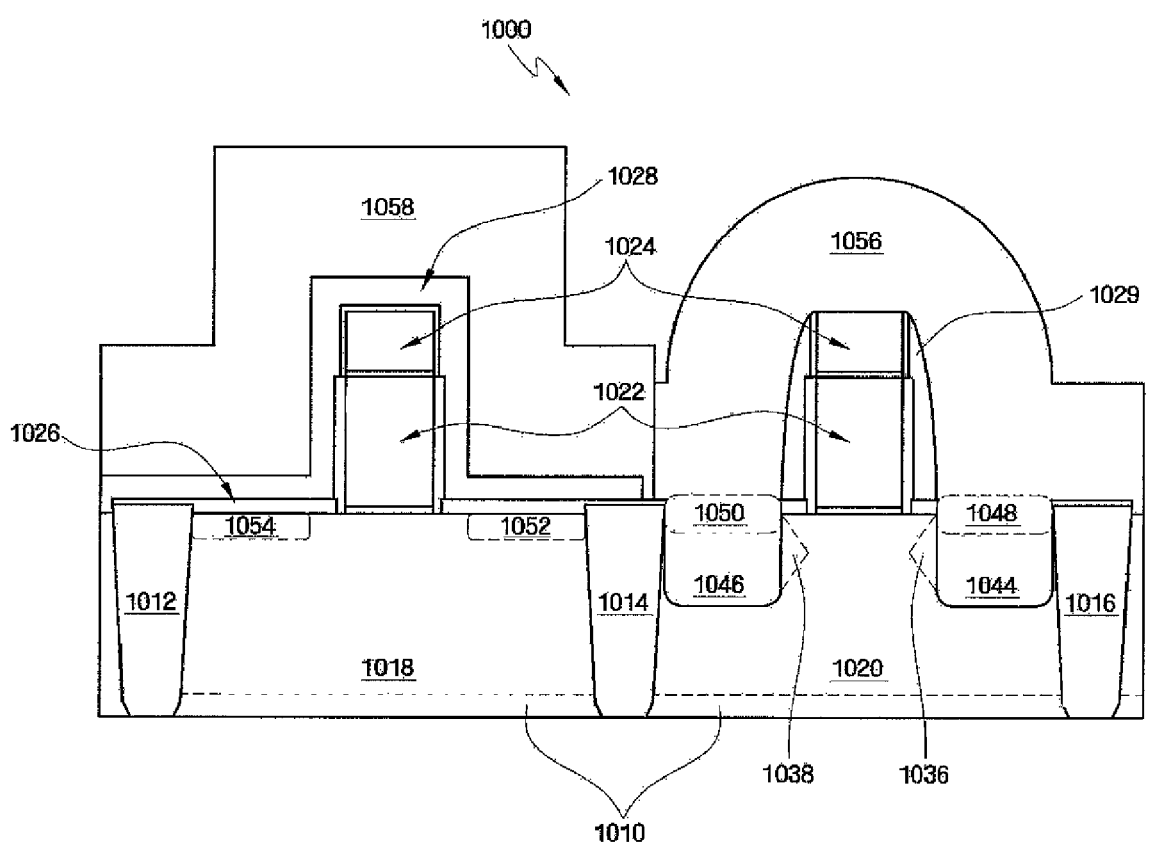
FIG. 10 shows a schematic vertical side view of a semiconductor structure after deposition of blocking oxide in accordance with an exemplary embodiment of the present disclosure.

As shown in FIG. 10, a semiconductor structure with blocking oxide deposition is indicated generally by the reference numeral 1000. The structure 1000 is similar to the structure 900, so duplicate description may be omitted. The structure 1000 includes a thick oxide layer having a first portion 1056 over the pFET and a second portion 1058 over the nFET.

Figure 11:
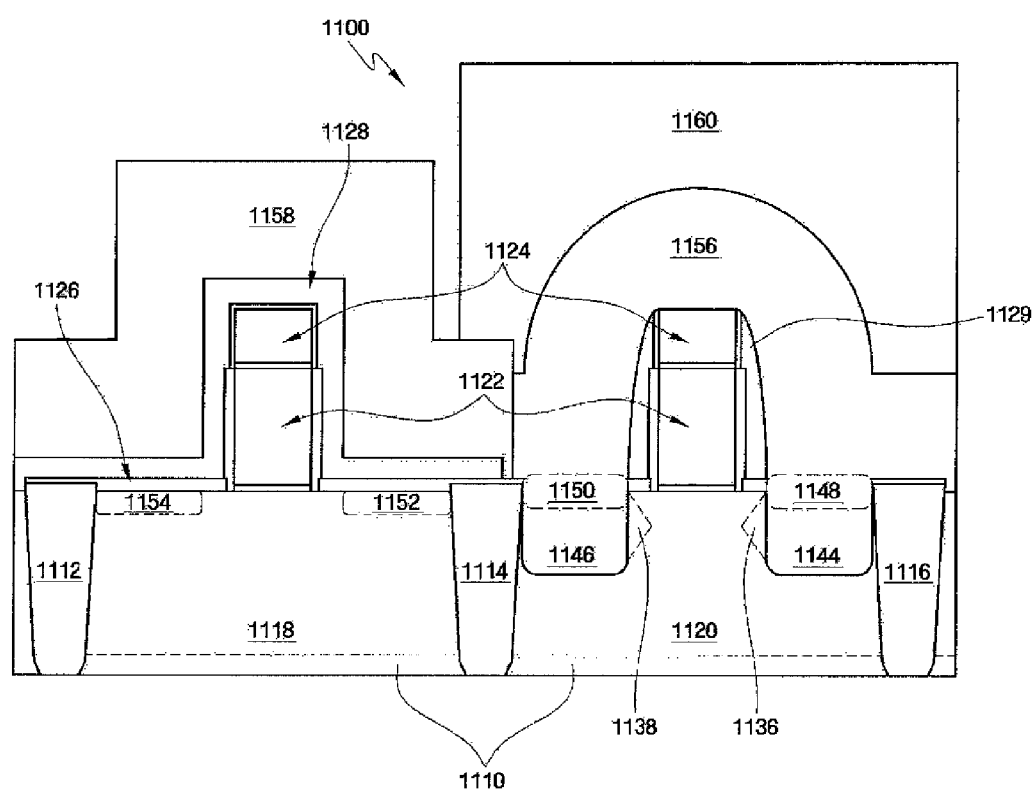
FIG. 11 shows a schematic vertical side view of a semiconductor structure having an nFET halo/extension implantation layer (BH) after deposition of photoresist by IPS to block the pFET in accordance with an exemplary embodiment of the present disclosure.

Turning to FIG. 11, a semiconductor structure having an nFET halo/extension implantation layer (BH) with deposition of photoresist by inductive plasma source (IPS) to block the pFET is indicated generally by the reference numeral 1100. The structure 1100 is similar to the structure 1000, so duplicate description may be omitted. The structure 1100 includes PR 1160 disposed on the oxide 1156.

Figure 12:
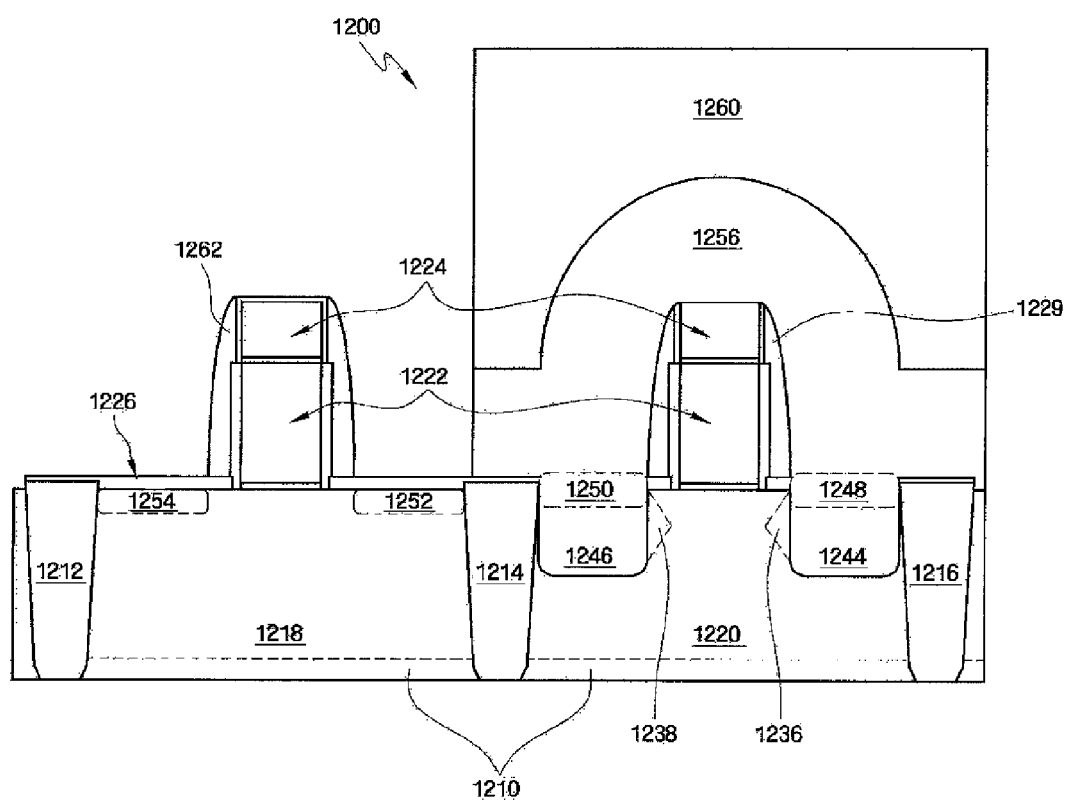
FIG. 12 shows a schematic vertical side view of a semiconductor structure after a two-step RIE of nitride spacer one on the nFET in accordance with an exemplary embodiment of the present disclosure.

Turning now to FIG. 12, a semiconductor structure with RIE of the first nitride spacer on the nFET is indicated generally by the reference numeral 1200. Here, the RIE is a two-step RIE, including a first step of isotropically (ISO) dry etching for oxide removal and a second step RIE of the first nitride spacer The structure 1200 is similar to the structure 1100, so duplicate description may be omitted In the structure 1200, the portion of the nitride layer 1228 that was above the p-well 1218 has been substantially reduced such that only nitride side walls 1262 remain around the nFET.

Figure 13:
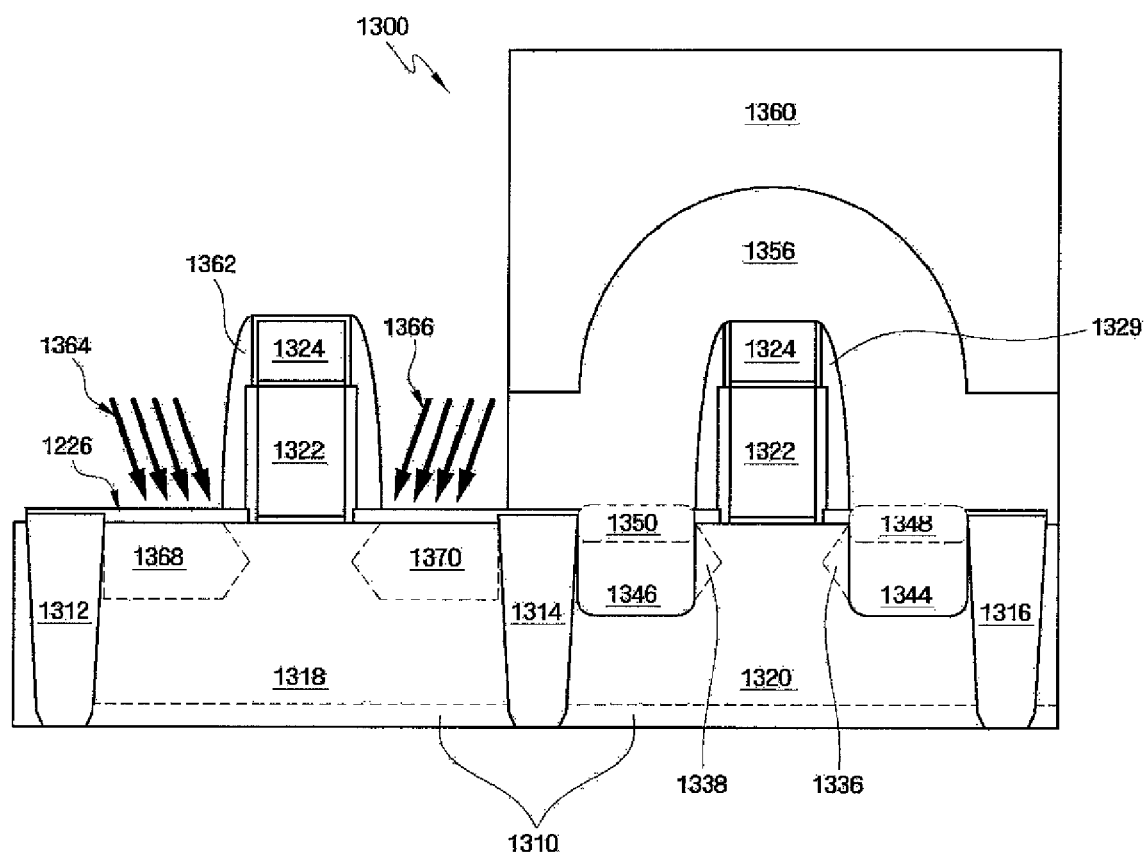
FIG. 13 shows a schematic vertical side view of a semiconductor structure during halo implantation about the nFET in accordance with an exemplary embodiment of the present disclosure.

As shown in FIG. 13, a semiconductor structure with halo implantation for nFET is indicated generally by the reference numeral 1300. In this example, the halo implantation is a quad implantation with both horizontal and vertical components for both vertical and horizontal transistors. The structure 1300 is similar to the structure 1200, so duplicate description may be omitted. The structure 1300 shows first and second halo implantation angles 1364 and 1366, with resulting halo portions 1368 and 1370, respectively. Here, the halo portion 1368 is disposed in the p-well 1318 adjacent to the first conductor 1312, and the halo portion 1370 is disposed in the p-well 1318 adjacent to the second conductor 1314.

Figure 14:
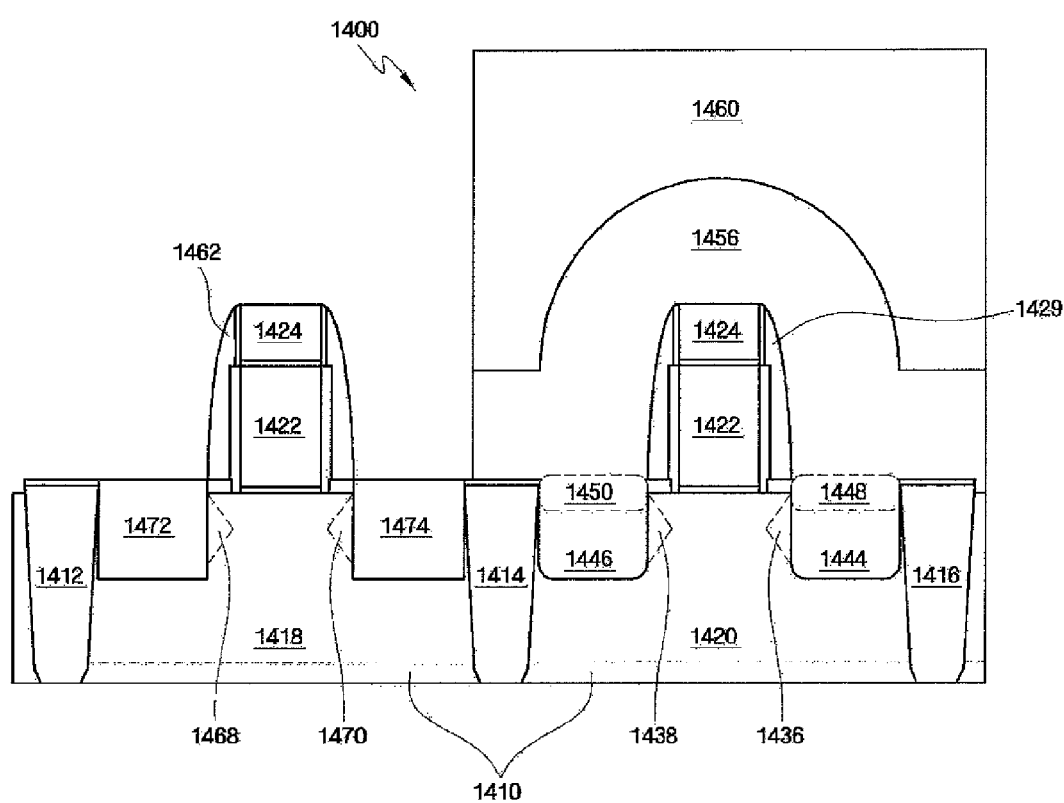
FIG. 14 shows a schematic vertical side view of a semiconductor structure after RIE of a recess in the Si in accordance with an exemplary embodiment of the present disclosure.

Turning to FIG. 14, a semiconductor structure with Si recess RIE is indicated generally by the reference numeral 1400. The structure 1400 is similar to the structure 1300, so duplicate description may be omitted. In the structure 1400, Si recesses 1472 and 1474 have been removed from the halo portions 1468 and 1470, respectively. Thus, the incidental implantations 1452 and 1454 have also been removed.

Figure 15:
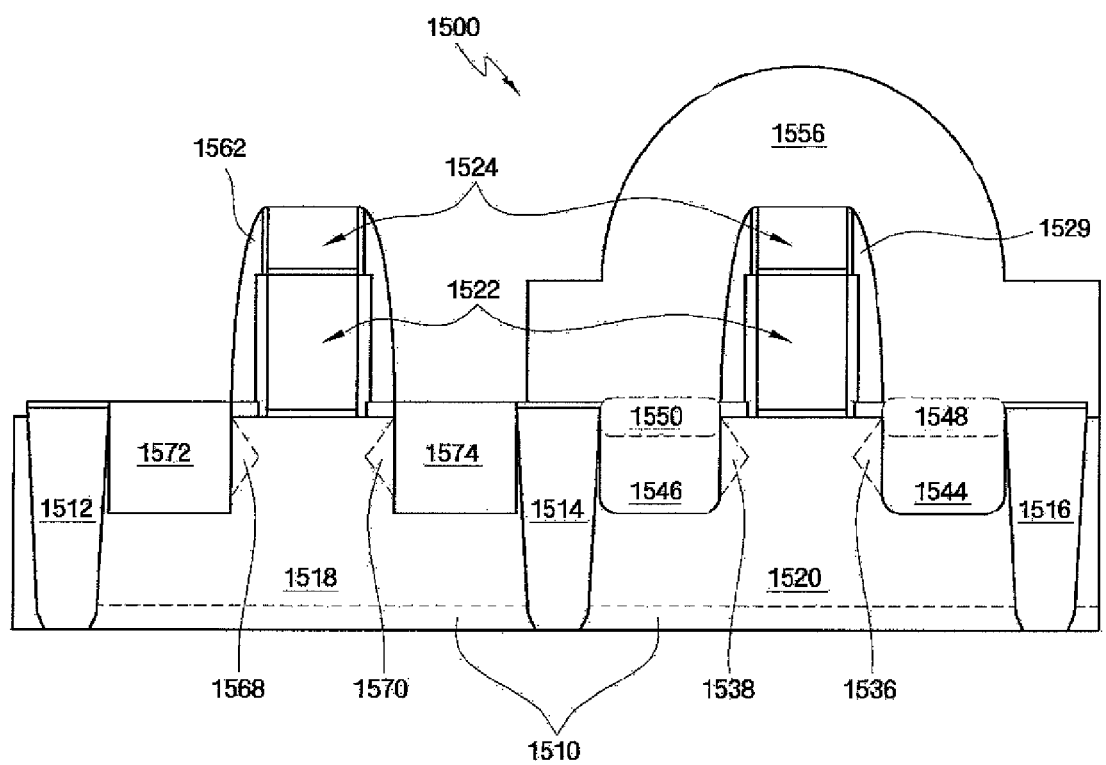
FIG. 15 shows a schematic vertical side view of a semiconductor structure after stripping of PR in accordance with an exemplary embodiment of the present disclosure.

Turning now to FIG. 15, a semiconductor structure with photoresist (PR) strip is indicated generally by the reference numeral 1500. The structure 1500 is similar to the structure 1400, so duplicate description may be omitted. In the structure 1500, the PR 1560 has been stripped away, uncovering the oxide layer 1556.

Figure 16:
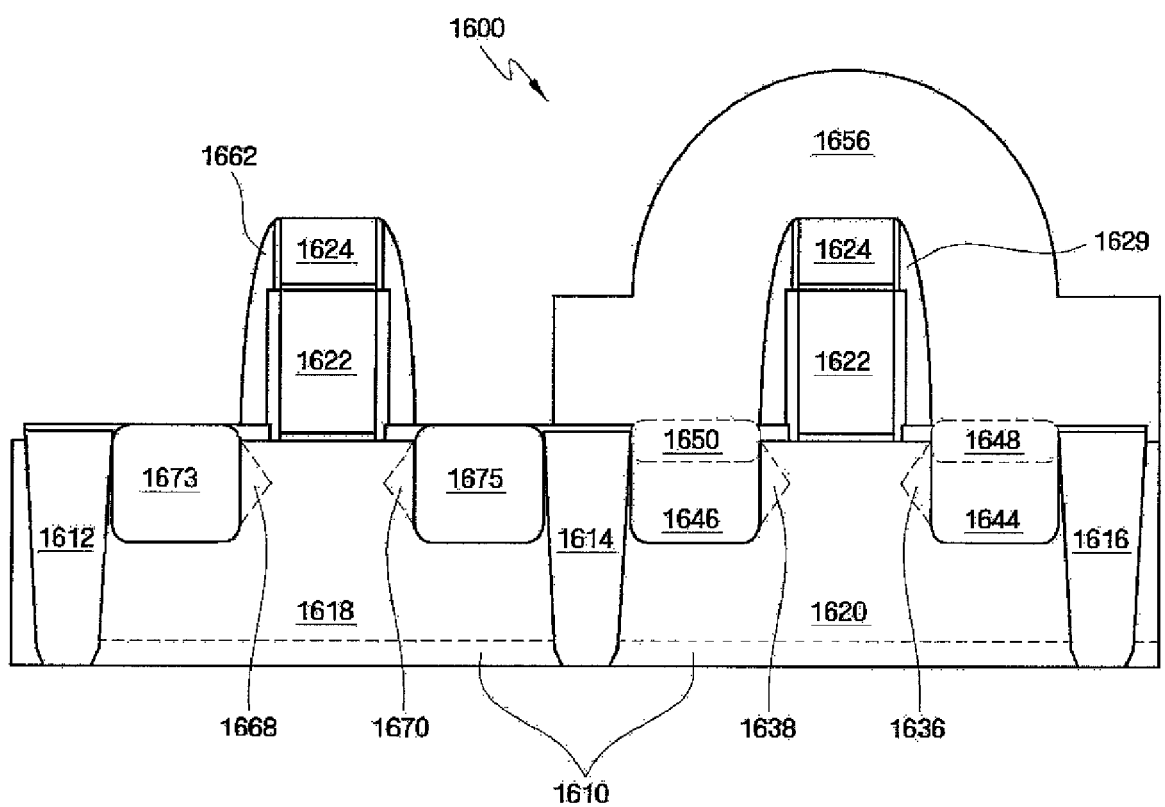
FIG. 16 shows a schematic vertical side view of a semiconductor structure after formation of epitaxially grown silicon-carbon (eSiC) in accordance with an exemplary embodiment of the present disclosure.

As shown in FIG. 16, a semiconductor structure with epitaxially grown silicon-carbon (eSiC) is indicated generally by the reference numeral 1600. The structure 1600 is similar to the structure 1500, so duplicate description may be omitted. The structure 1600 further includes silicon-carbon (SiC) EPI portions 1673 and 1675 filling the Si recesses 1672 and 1674, respectively.

Figure 17:
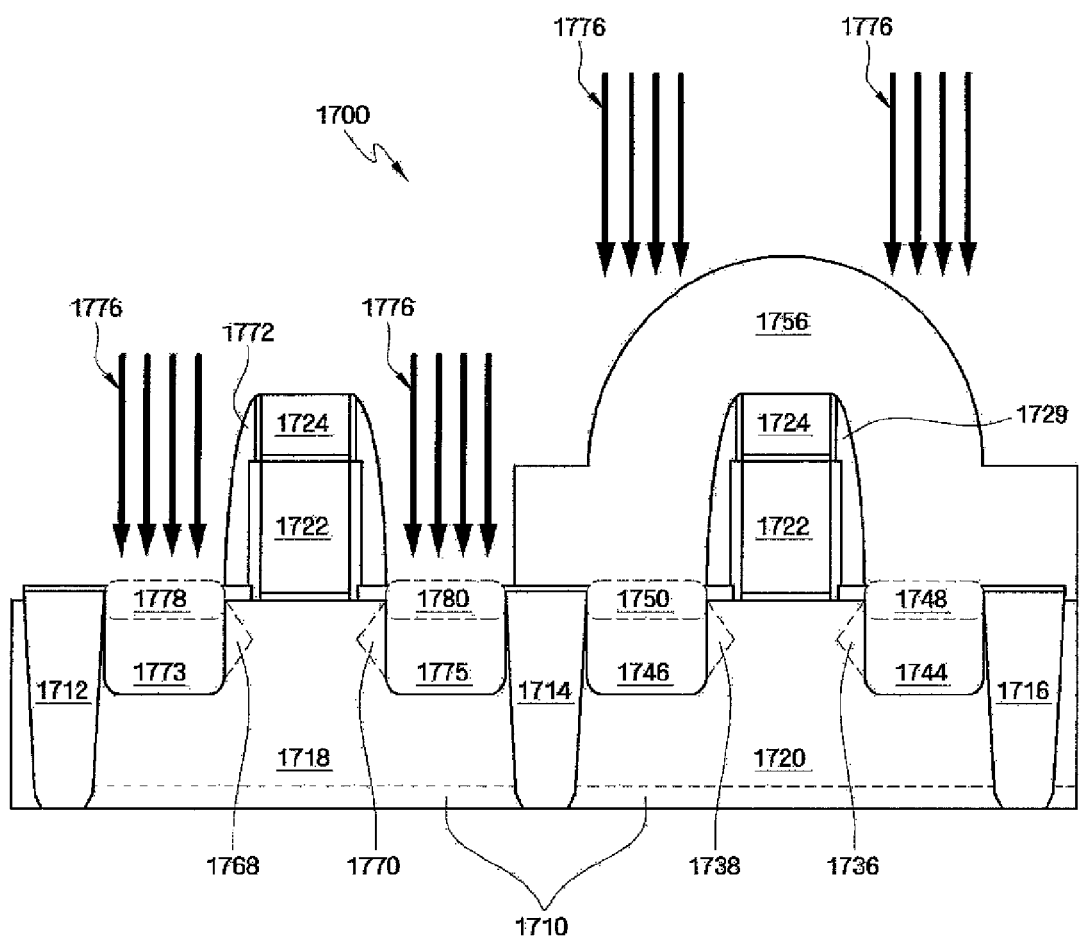
FIG. 17 shows a schematic vertical side view of a semiconductor structure during implantation of an nFET extension in accordance with an exemplary embodiment of the present disclosure.

Turning to FIG. 17, a semiconductor structure with nFET extension implantation is indicated generally by the reference numeral 1700. The structure 1700 is similar to the structure 1600, so duplicate description may be omitted. The structure 1700 includes implantation flow 1776, and resulting extension portions 1778 and 1780 in the EPI portions 1773 and 1775 of the nFET, respectively. Here, there are no new incidental extension portions in the pFET because it is still protected by the oxide layer 1756.

Figure 18:
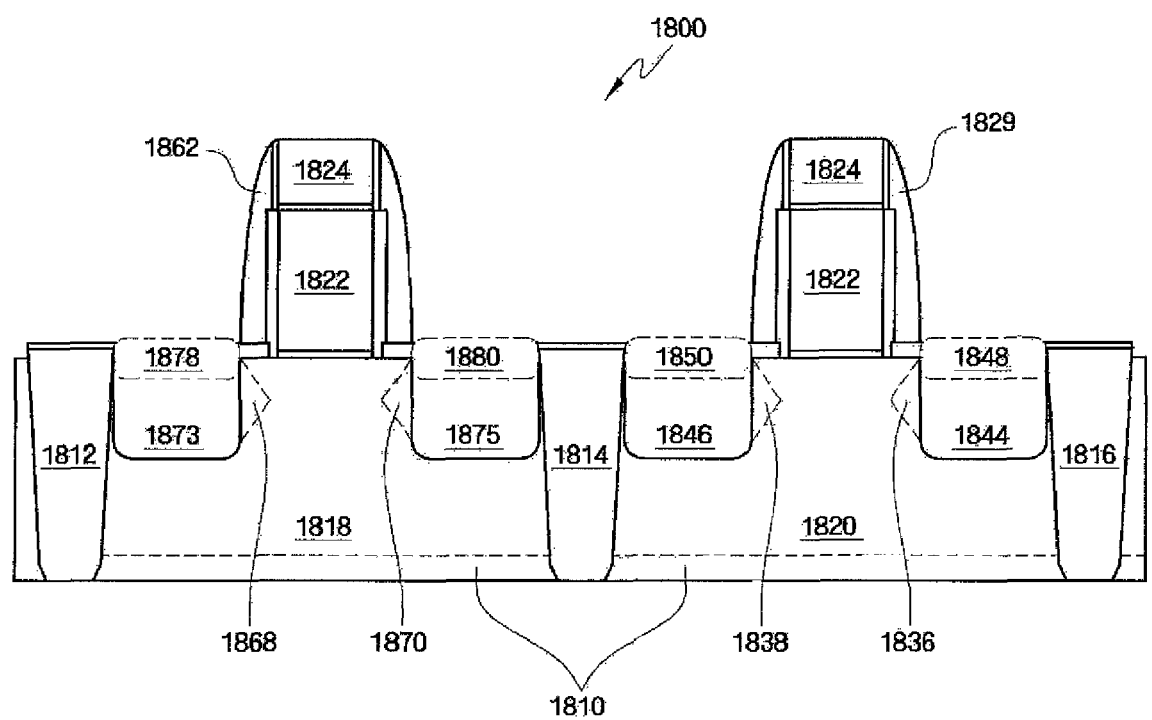
FIG. 18 shows a schematic vertical side view of a semiconductor structure after removal of oxide in accordance with an exemplary embodiment of the present disclosure.

Turning now to FIG. 18, a semiconductor structure with oxide removal is indicated generally by the reference numeral 1800. The structure 1800 is similar to the structure 1700, so duplicate description may be omitted. In the structure 1800, the oxide layer above the pFET has been removed.

Figure 19:
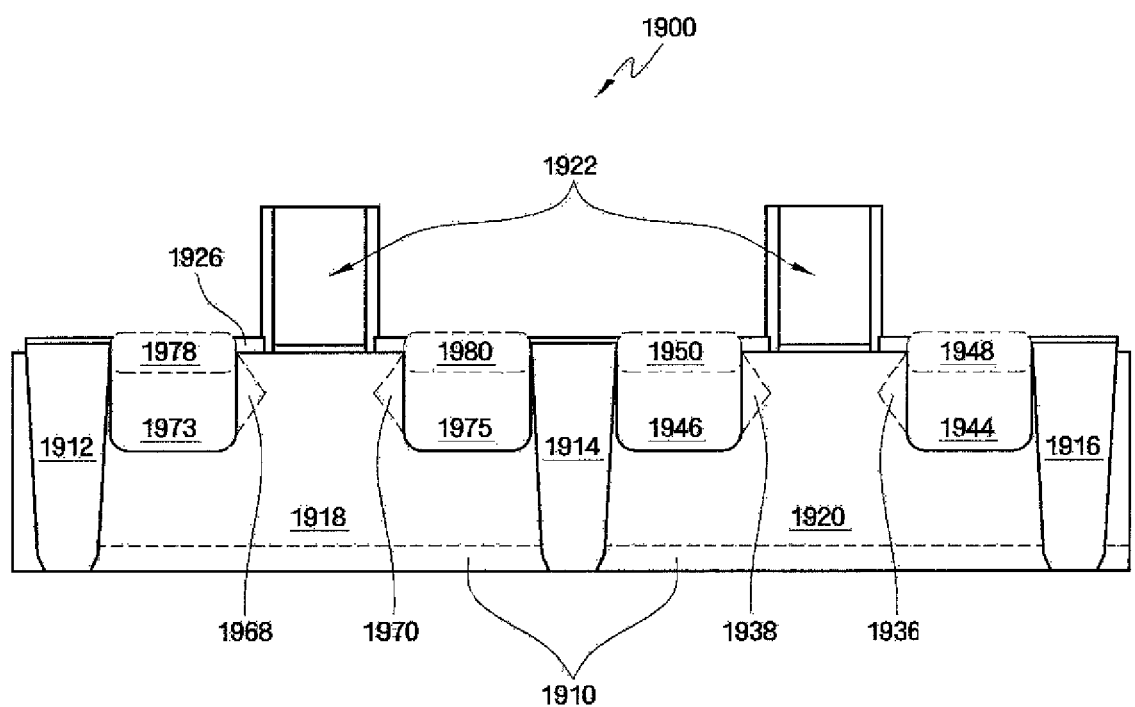
FIG. 19 shows a schematic vertical side view of a semiconductor structure after removal of nitride in accordance with an exemplary embodiment of the present disclosure.

As shown in FIG. 19, a semiconductor structure with nitride removal is indicated generally by the reference numeral 1900. The structure 1900 is similar to the structure 1800, so duplicate description may be omitted. In the structure 1900, the nitride caps and sidewalls have been removed from both the nFET and pFET.

Figure 20:
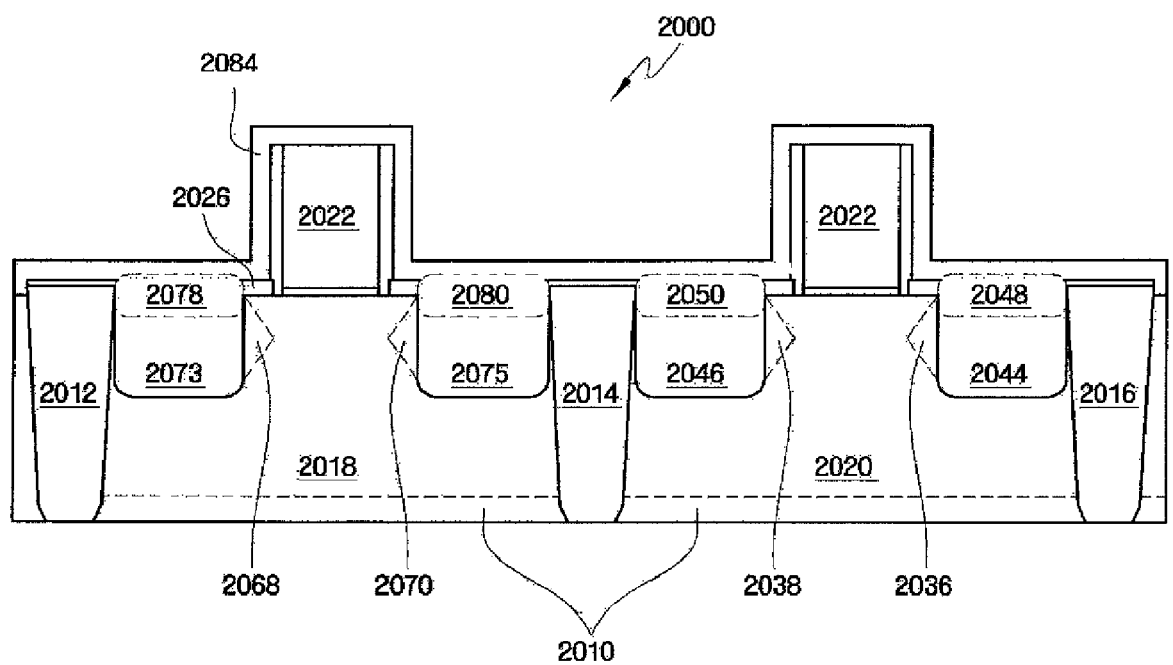
FIG. 20 shows a schematic vertical side view of a semiconductor structure after oxide deposition of an etch stop layer for spacer two in accordance with an exemplary embodiment of the present disclosure.

Turning to FIG. 20, a semiconductor structure with second spacer etch stop layer oxide deposition is indicated generally by the reference numeral 2000. The structure 2000 is similar to the structure 1900, so duplicate description may be omitted. In the structure 2000, an oxide layer 2084 is disposed on the top surface.

Figure 21:
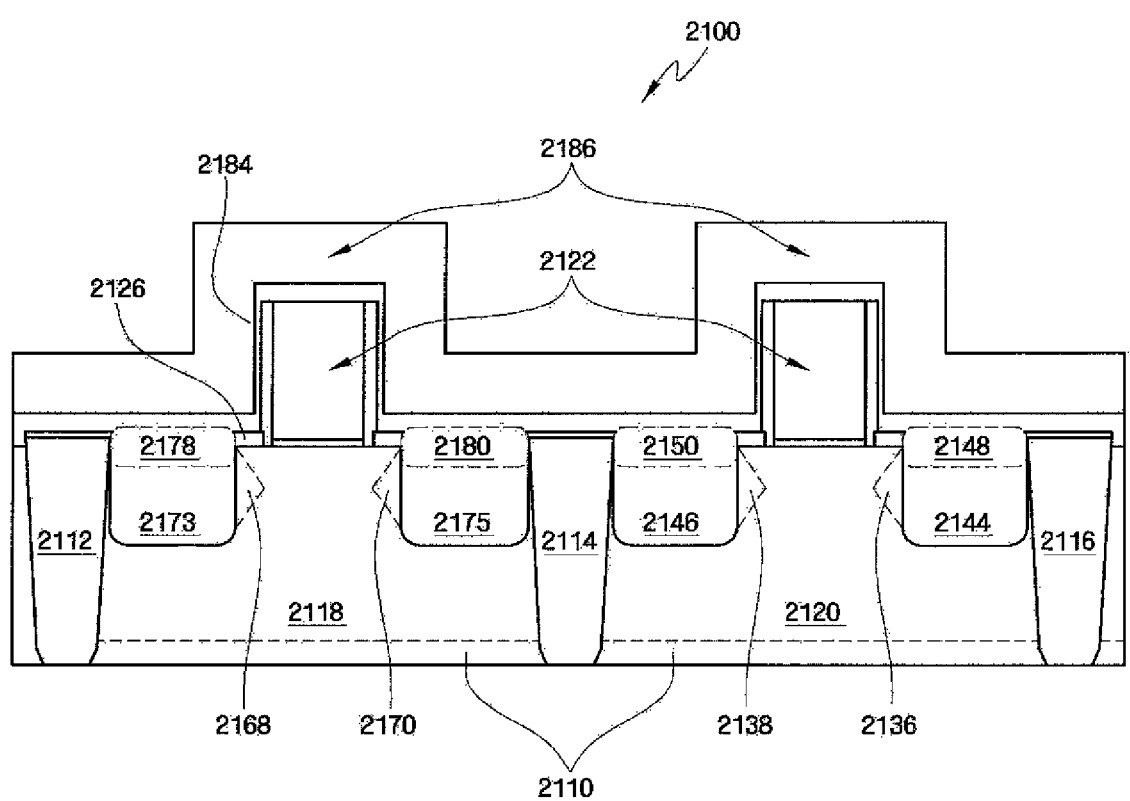
FIG. 21 shows a schematic vertical side view of a semiconductor structure after nitride deposition of spacer two in accordance with an exemplary embodiment of the present disclosure.

Turning now to FIG. 21, a semiconductor structure with second spacer nitride deposition is indicated generally by the reference numeral 2100. The structure 2100 is similar to the structure 2000, so duplicate description may be omitted. In the structure 2100, a thick nitride layer 2186 is disposed on the oxide layer 2184.

Figure 22:
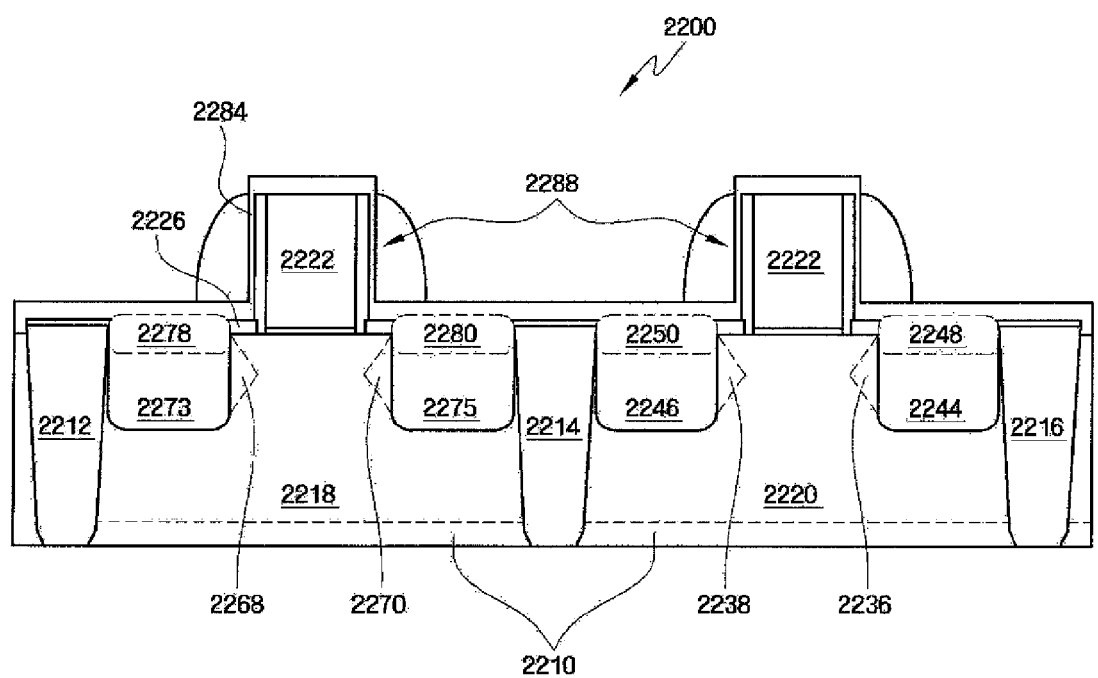
FIG. 22 shows a schematic vertical side view of a semiconductor structure after RIE of spacer two nitride in accordance with an exemplary embodiment of the present disclosure.

As shown in FIG. 22, a semiconductor structure with second spacer nitride RIE is indicated generally by the reference numeral 2200. The structure 2200 is similar to the structure 2100, so duplicate description may be omitted. In the structure 2200, the nitride layer 2186 has been substantially removed, with only nitride sidewalls 2288 remaining about the nFET and pFET.

Figure 23:
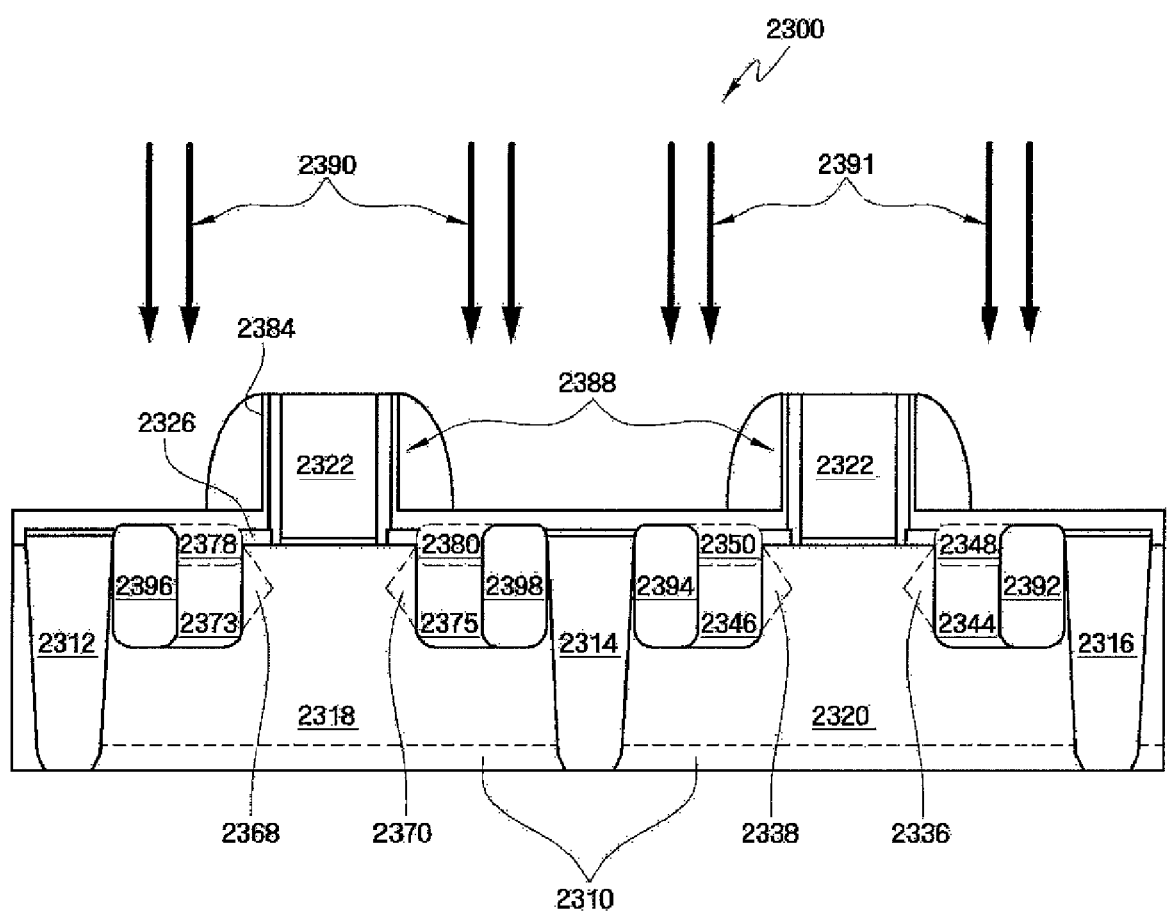
FIG. 23 shows a schematic vertical side view of a semiconductor structure during deep source/drain implantation of nFET and pFET in accordance with an exemplary embodiment of the present disclosure.

Turning to FIG. 23, a semiconductor structure with nFET and pFET deep source/drain (S/D) implantation is indicated generally by the reference numeral 2300. The structure 2300 is similar to the structure 2200, so duplicate description may be omitted. In the structure 2300, an nFET implantation flow 2390 implants S/D regions 2396 and 2398 adjacent to the first conductor 2312 and the second conductor 2314, respectively. A pFET implantation flow 2391 implants S/D regions 2394 and 2392 adjacent to the second conductor 2314 and the third conductor 2316, respectively.

In operation, embodiments of the present disclosure provide stress optimization during manufacturing of dual embedded epitaxially grown (EPI) semiconductor structures. Such embodiments use just two masks, which is a cost-effective improvement over the typical six masks. The halo implantations are performed early in the process, and prior to recessing the silicon. Further, a blanket extension implantation is possible since the same dopants are used, and one of the nFET or pFET is to be recessed after extension implantation of the other.

Typically, embedded epitaxial uniaxial channel stress engineering may use complicated processing to prevent stress relaxation following halo implantation. Such processing may separate one quad halo step into two dual tr54halo steps for vertical and horizontal transistors. Unfortunately, such typical methods can add additional lithography process steps and increase costs.

Embodiments of the present disclosure use an optimized integration scheme that can save four lithography process steps and related masks. Typical processing uses a total of six (6) masks, such as nFET and pFET open for embedded epitaxial using SiC and SiGe, and separated halo implantation masks for both horizontal and vertical PC. In contrast, embodiments of the present disclosure merge these steps together into nFET and pFET open mask for embedded epitaxial, so such embodiments only need two (2) masks for nFET and pFET.

For example, the mask set for typical processes might include (1) a pFET open mask, (2) a horizontal pFET halo implantation mask, (3) a vertical pFET halo implantation mask, (4) an nFET open mask, (5) a horizontal nFET halo implantation mask, and (6) a vertical nFET halo implantation mask. In contrast, embodiments of the present disclosure use a mask set with just two masks, including (1) a pFET open mask and (2) an nFET open mask.

In exemplary embodiments, quad halo implantation is accomplished by using the open masks. In addition, halo implantation and cavity recessing is merged into one lithography process.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. such changes and modifications are intended to be included within the scope of the present disclosure as set forth in the appended claims.

What is claimed is:

1. A method of manufacturing dual embedded epitaxially grown semiconductor transistors, the method comprising:
   depositing a first elongated oxide spacer over first and second transistors of different types, each having a nitride cap formed thereon;
   depositing a first elongated nitride spacer on the first oxide spacer;
   depositing a first photoresist block on the nitride spacer above the first transistor;
   etching the first nitride spacer above the second transistor;
   implanting a first halo around the second transistor;
   etching a first recess in an outer portion of the first halo;
   stripping the first photoresist above the first transistor;
   forming a first epitaxially grown semiconductor material in the first recess;
   implanting a first extension in a top portion of the first material;
   depositing an elongated blocking oxide over the first and second transistors and first extension;
   depositing a second photoresist block on the blocking oxide above the second transistor and first extension;
   etching the blocking oxide and first nitride spacer above the first transistor;
   implanting a second halo around the first transistor;
   etching a second recess in an outer portion of the second halo;
   stripping the second photoresist above the second transistor;
   forming a second epitaxially grown semiconductor material in the second recess;
   implanting a second extension in a top portion of the second material;
   etching the blocking oxide above the second transistor;
   etching the nitride caps from the first and second transistors;
   depositing a second elongated oxide spacer on the first and second transistors;
   depositing a second elongated nitride spacer on the second oxide spacer;
   etching the second nitride spacer to leave nitride sidewalls around gates of the first and second transistors; and
   implanting deep sources and drains in the first and second transistors.

2. The method of claim 1 wherein the first and second transistors are complementary metal-oxide semiconductor (CMOS) devices.

3. The method of claim 1 wherein the first transistor is one of negative channel field effect transistor (nFET) or positive channel field effect transistor (pFET) type, and the second transistor is the other of nFET or pFET type.

4. The method of claim 1 wherein the first epitaxially grown semiconductor material is one of silicon-germanium (SiGe) or silicon-carbon (SiC), and the second epitaxially grown semiconductor material is the other of SiGe or SiC.

5. The method of claim 1 wherein no more than a first open mask is used for the first transistor, and no more than a second open mask is used for the second transistor.

6. The method of claim 1 wherein the first extension implanted in the top portion of the first material around the second transistor is incidentally implanted around the first transistor and removed during etching of the second recess around the first transistor.

7. The method of claim 1 wherein the first elongated oxide spacer is formed by re-oxidation.

8. The method of claim 1 wherein etching the first nitride spacer above the second transistor leaves at least one structurally supportive nitride sidewall around a gate of the second transistor.

9. The method of claim 1 wherein the first photoresist block above the first transistor is deposited by an inductive plasma source (IPS).

10. The method of claim 1 wherein the etch of the first nitride spacer comprises a reactive ion etch (RIE).

11. The method of claim 1 wherein implanting the first halo around the second transistor is by a quad halo implantation.

12. The method of claim 1 wherein etching the first recess is by reactive ion etch (RIE) of silicon (Si).

13. The method of claim 1 wherein the first epitaxially grown (EPI) semiconductor material comprises EPI silicon-germanium (eSiGe).

14. The method of claim 1 wherein the second photoresist block above the second transistor is deposited by an inductive plasma source (IPS).

15. The method of claim 1 wherein etching the blocking oxide and first nitride spacer above the first transistor comprises a two-step process including isotropic (ISO) etching of the blocking oxide and reactive ion etching (RIE) of the first nitride spacer.

16. The method of claim 1 wherein implanting the second halo around the first transistor is by a quad halo implantation.

17. The method of claim 1 wherein etching the second recess around the first transistor is by reactive ion etch (RIE) of silicon (Si).

18. The method of claim 1 wherein the second epitaxially grown (EPI) semiconductor material comprises EPI silicon-carbon (eSiC).

19. The method of claim 1 wherein the second elongated oxide spacer on the first and second transistors comprises an etch stop layer.

20. The method of claim 1 wherein the gate of at least one of the first or second transistors comprises a polyconductor.

21. The method of claim 1 wherein the gates of the first and second transistors are substantially the same.

22. The method of claim 1 wherein the nitride sidewalls etched from the second nitride spacer around the gates of the first and second transistors are structurally supportive and permanent.

23. The method of claim 1 wherein implanting deep sources and drains in the first and second transistors comprises implanting a deep source and drain in one of the first or second transistors using a first open mask or plasma, and implanting a deep source and drain in the other of the first or second transistors using a second open mask or plasma.

24. The method of claim 1 wherein a first dopant is used for both the first halo and the second extension, and a second dopant is used for both the first extension and the second halo.

25. The method of claim 24 wherein the first dopant comprises arsenic (As) and the second dopant comprises boron and/or boron difluoride (B/BF2).

26. The method of claim 1 wherein the blocking oxide is thicker than the first or second oxide spacers.

27. The method of claim 26 wherein the blocking oxide is between about 450 and about 550 Angstroms thick.

* * * * *